(12) United States Patent
Escobar Valderrama et al.

(10) Patent No.: US 7,720,623 B2
(45) Date of Patent: May 18, 2010

(54) FIXED REFERENCE FRAME PHASE-LOCKED LOOP (FRF-PLL) FOR UNBALANCED LINE VOLTAGE CONDITIONS

(75) Inventors: Gerardo Escobar Valderrama, San Luis Potosi (MX); Raymundo Enrique Torres Olguin, San Luis Potosi (MX); Misael Fransisco Martinez Montejano, San Luis Potosi (MX)

(73) Assignee: Instituto Potosino de Investigacion Cientifica y Tecnologica (IPICYT), Sanluis Potos (MX)

( * ) Notice: Subject to any disclaimer, the term of this patent is extended or adjusted under 35 U.S.C. 154(b) by 206 days.

(21) Appl. No.: 11/977,023

(22) Filed: Oct. 23, 2007

(65) Prior Publication Data
US 2009/0105979 A1   Apr. 23, 2009

(51) Int. Cl.
*G06F 19/00* (2006.01)
(52) U.S. Cl. .................................................. 702/72
(58) Field of Classification Search .................... 702/72
See application file for complete search history.

(56) References Cited
U.S. PATENT DOCUMENTS
5,412,353 A  *  5/1995  Chaplik et al. .............. 332/127
* cited by examiner

*Primary Examiner*—Tung S Lau
(74) *Attorney, Agent, or Firm*—Defillo & Associates, Inc.; Evelyn A. Defilló

(57) ABSTRACT

The present invention relates to a system to implement a phase-locked loop (PLL) which is able to provide an estimation of the angular frequency, and both the positive and negative sequences of the fundamental component of a three-phase signal. These sequences are provided in fixed reference frame coordinates.

9 Claims, 7 Drawing Sheets

General schematic diagram of the connection of the FRF-PLL system to the utility grid.

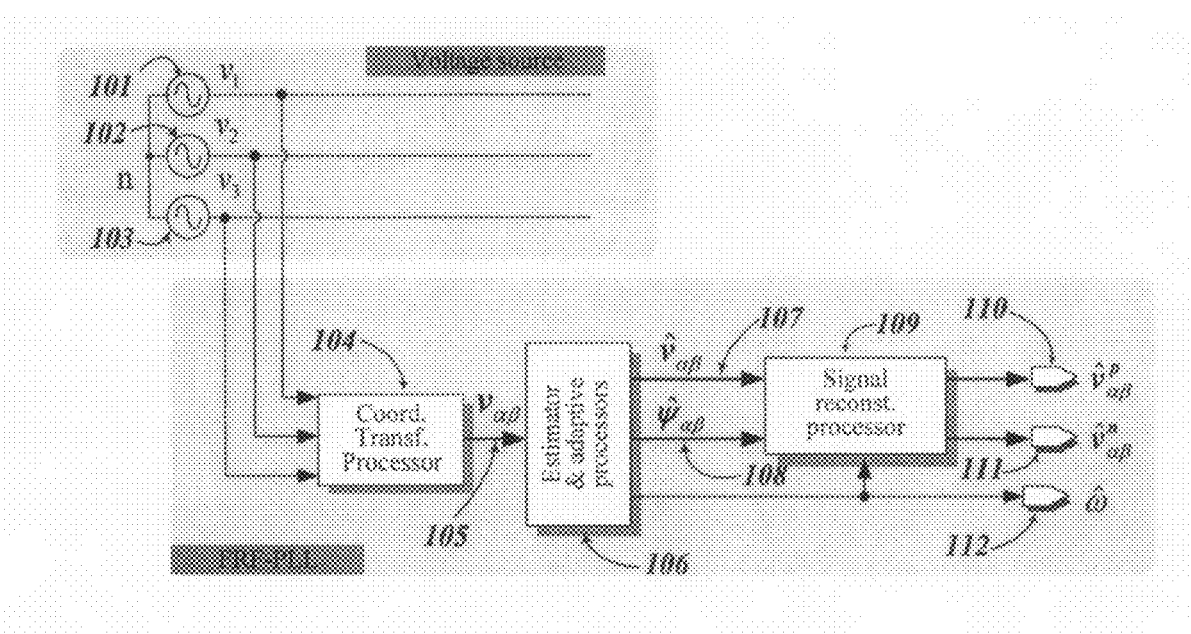
Fig. 1. General schematic diagram of the connection of the FRF-PLL system to the utility grid.

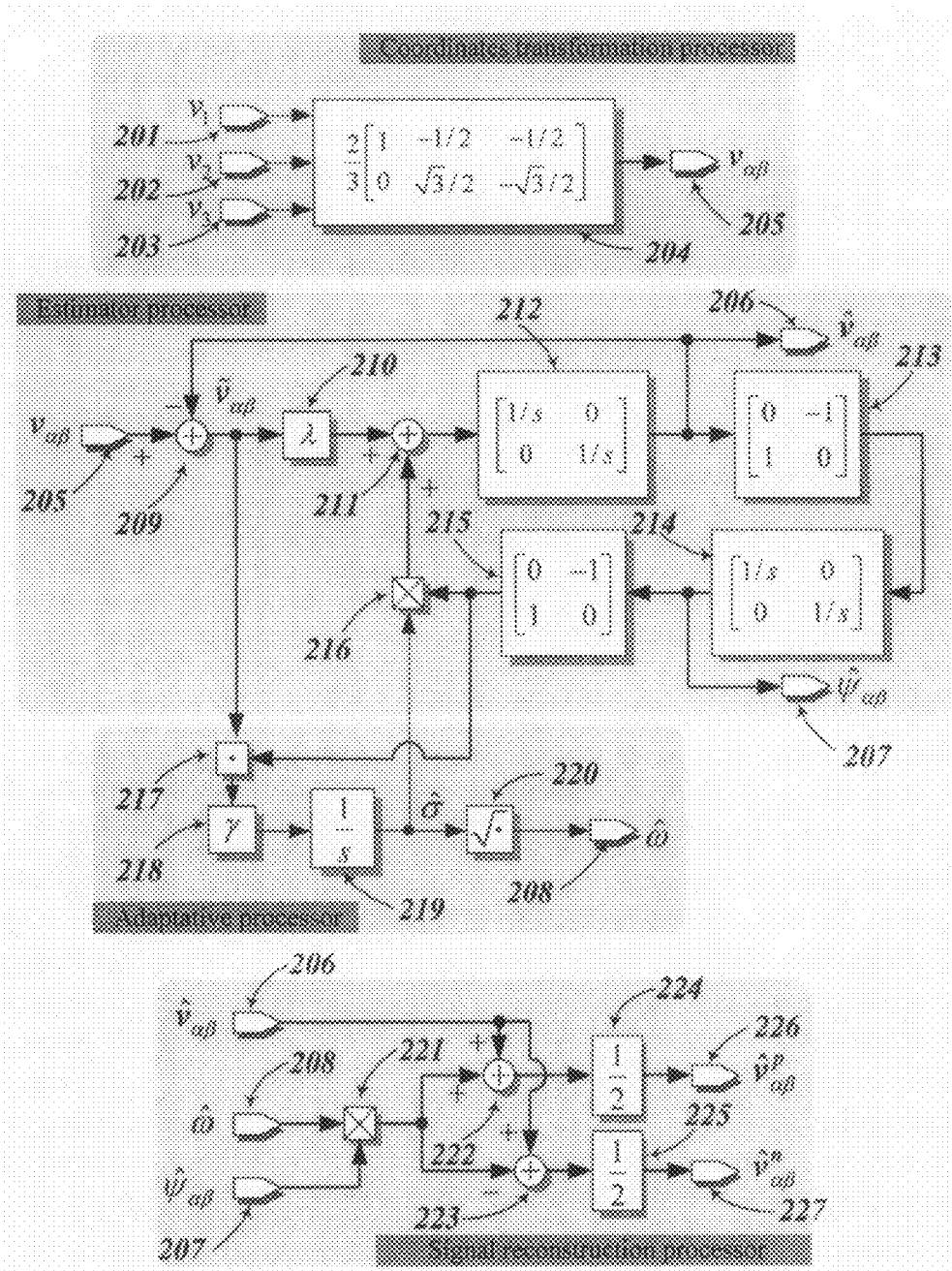
Fig. 2. Detailed block diagram of the proposed FRF-PLL algorithm.

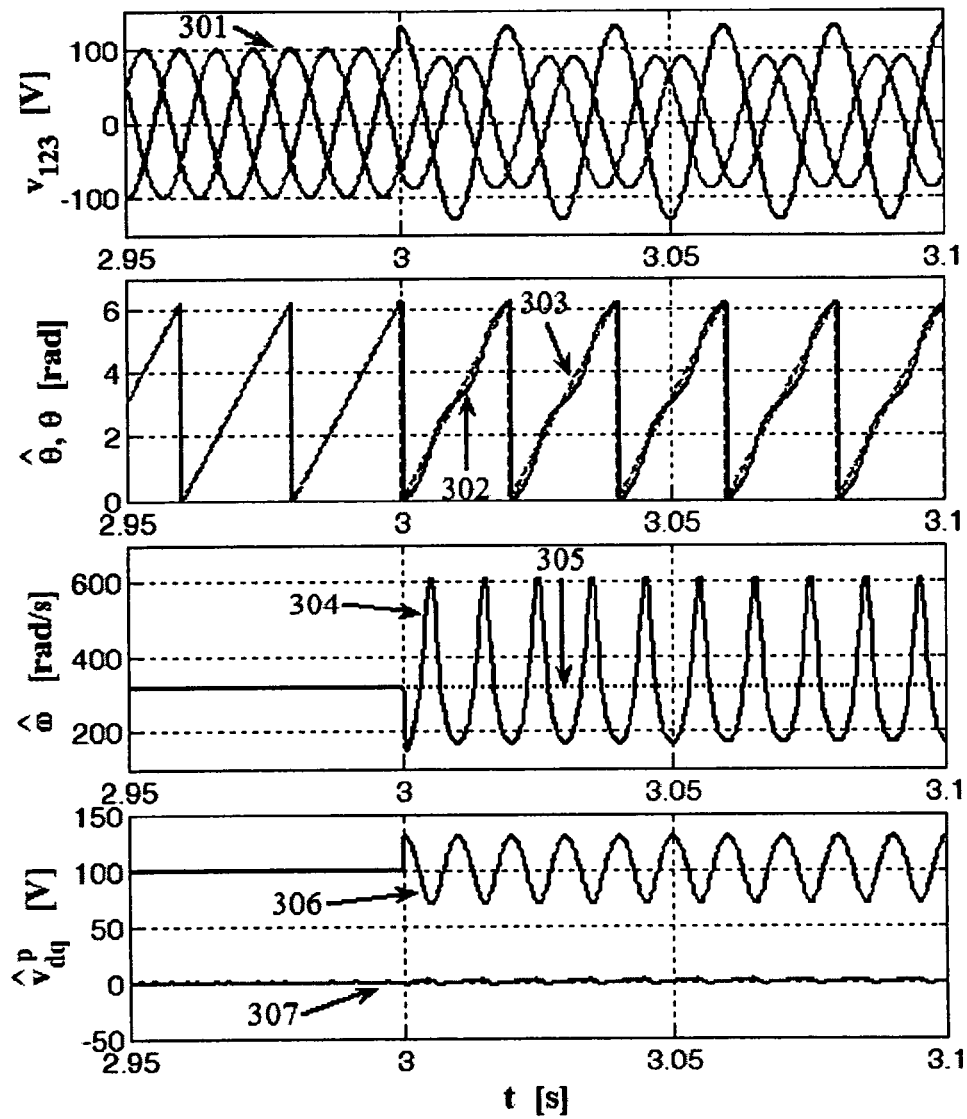
Fig. 3. Transient response of the conventional SRF-PLL when the utility voltage goes from a balanced to an unbalanced condition. (from top to bottom) Utility voltage $v_{123}$, estimated phase angle $\hat{\theta}$, estimated angular frequency $\hat{\omega}$, and estimated positive-sequence voltage in the synchronous reference frame $\hat{v}_{dq}^{p}$.

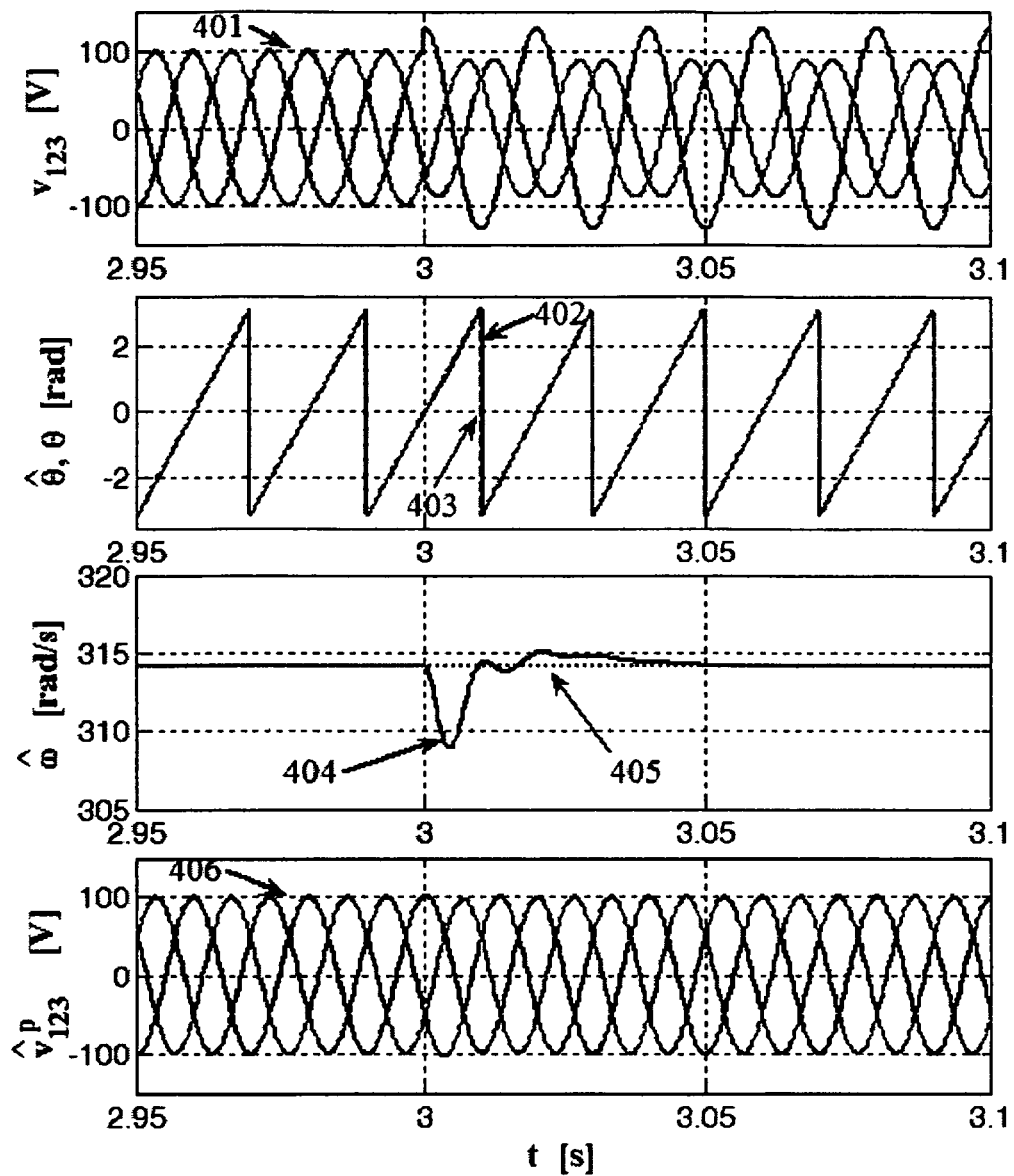
Fig. 4. Transient response of the proposed FRF-PLL when the utility voltage passes from a balanced to an unbalanced condition. (from top to bottom) Utility voltage $v_{123}$, estimated phase angle $\hat{\theta}$, estimated angular frequency $\hat{\omega}$, and estimated positive-sequence voltage $\hat{v}^p_{123}$.

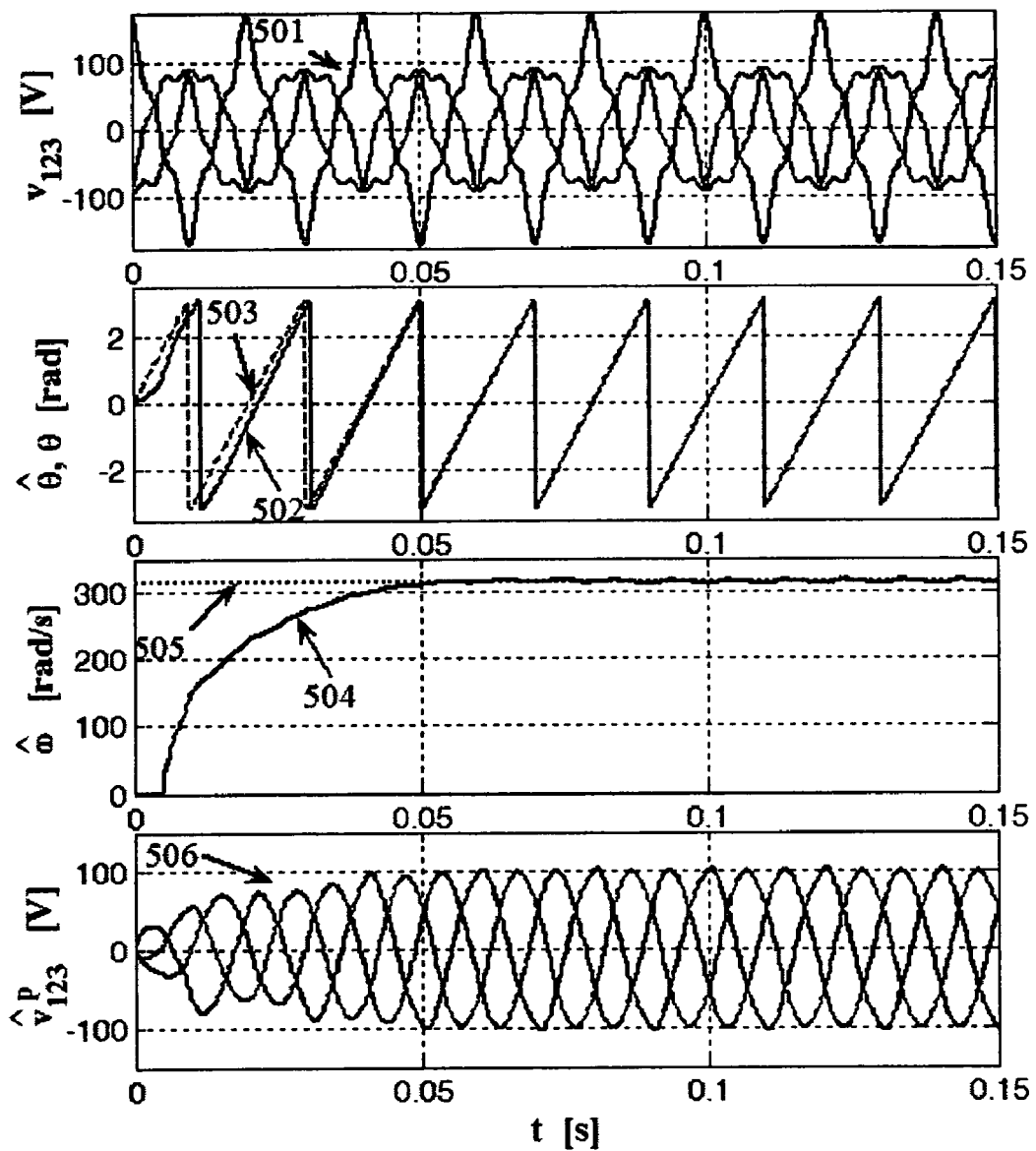
Fig. 5. Response of the proposed FRF-PLL to an unbalanced distorted utility voltage during start-up. (from top to bottom) Utility voltage $v_{123}$, estimated phase angle $\hat{\theta}$, estimated angular frequency $\hat{\omega}$, and estimated positive-sequence voltage $\hat{v}_{123}^p$.

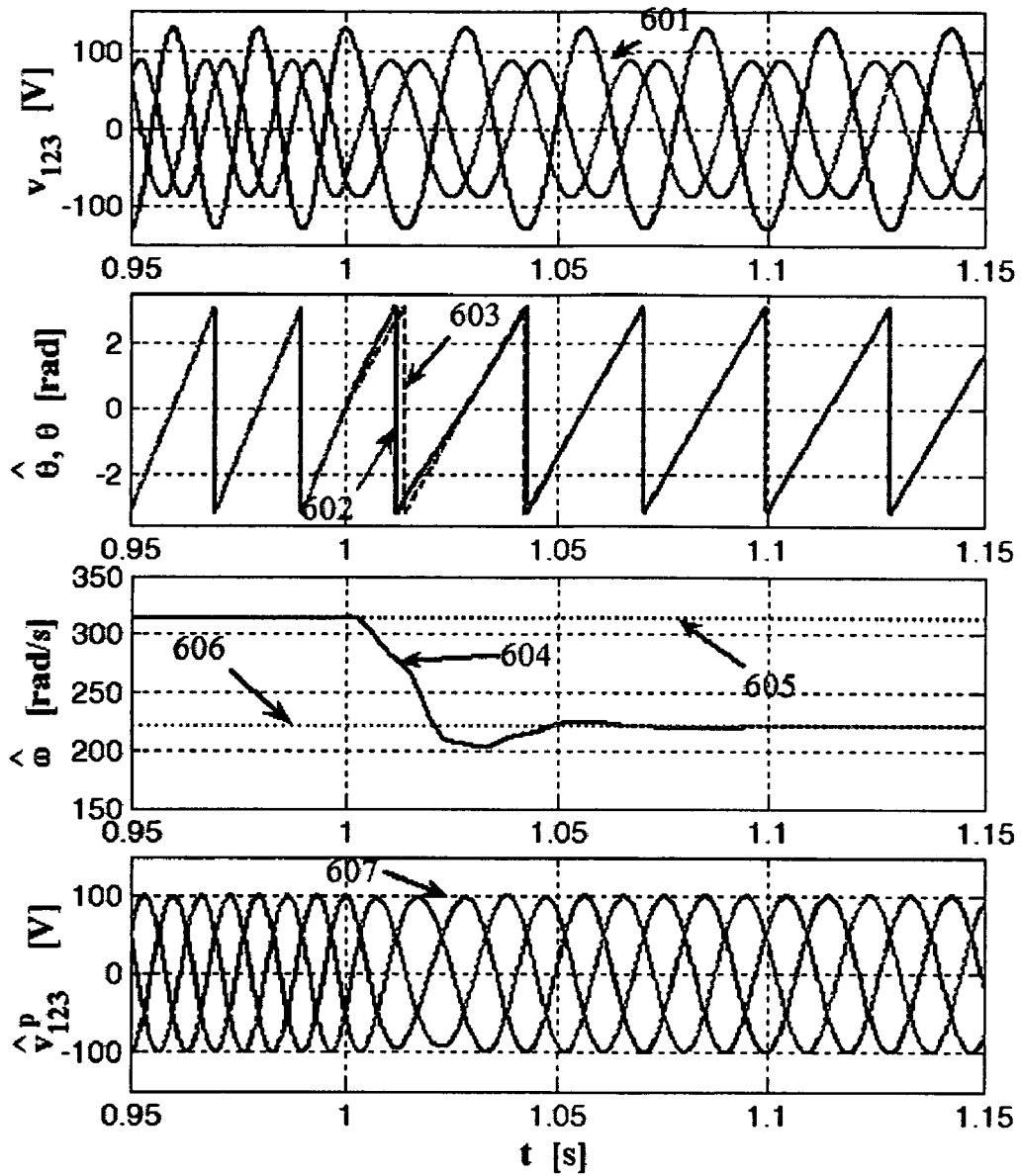
Fig. 6. Transient response of the proposed FRF-PLL to a utility frequency change from 50Hz to 35Hz. (from top to bottom) Utility voltage $v_{123}$, estimated phase angle $\hat{\theta}$, estimated angular frequency $\hat{\omega}$, and estimated positive-sequence voltage $\hat{v}^p_{123}$.

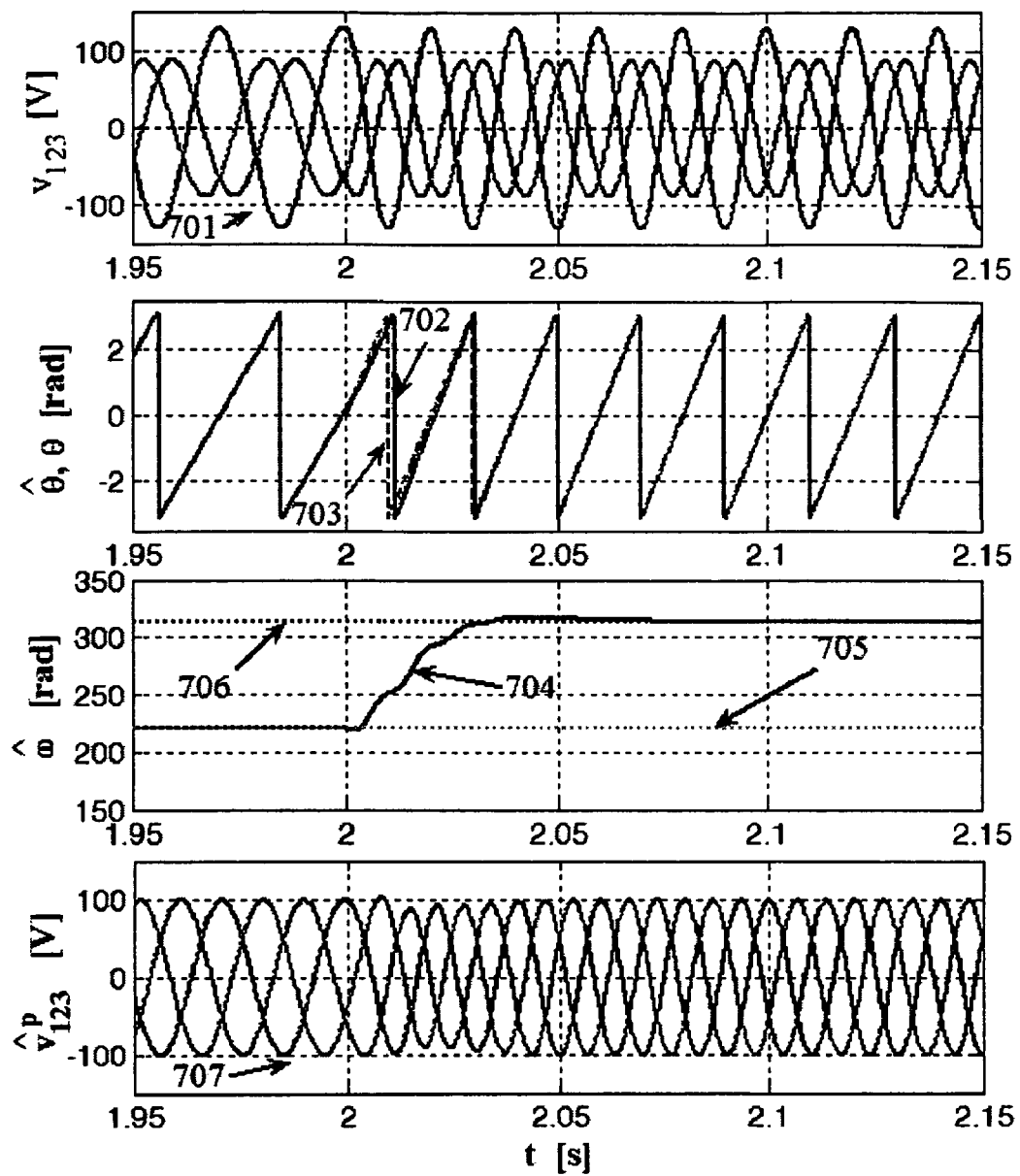
Fig. 7. Transient response of the proposed FRF-PLL to a utility frequency change from 35Hz to 50Hz. (from top to bottom) Utility voltage $v_{123}$, estimated phase angle $\hat{\theta}$, estimated angular frequency $\hat{\omega}$, and estimated positive-sequence voltage $\hat{v}^p_{123}$.

FIXED REFERENCE FRAME PHASE-LOCKED LOOP (FRF-PLL) FOR UNBALANCED LINE VOLTAGE CONDITIONS

FIELD OF THE INVENTION

The present invention is related with the design of phase-locked loops (PLL) algorithms which are able to provide synchronization between two periodic signals by reducing the difference of the phase angle between them, and thus providing a detection mechanism to reconstruct the phase angle and the angular frequency of the reference signal. Although PLLs have been widely used in many electronic applications, the PLL presented here is of special interest in the synchronization of power electronic equipment coupled with the electric network, such as controlled AC-DC converters, cycloconverters, active filters and other energy storage devices. In particular, the presented PLL has been designed to work in three-phase electric utility operating under unbalanced and distorted conditions.

BACKGROUND OF THE INVENTION

One of the most important aspects to consider in the control of grid-connected devices (such as controlled AC-DC converters, active filters, cycloconverters, and other energy storage systems coupled with the utility voltage) is the proper synchronization with the reference grid. The most widely accepted solution to provide this synchronization are the PLL technics. In general, a conventional PLL comprises a phase frequency detector (PFD) aimed to detect phase error and frequency error between the sensed input signal and an internally reconstructed signal. This error signal is processed in a filter and the result is used to adjust the frequency of a voltage controlled oscillator (VCO). This process continues until the angular frequency and phase angle of the internally reconstructed signal match those of the input signal. A PLL of the generic type is specified in the U.S. Pat. No. 6,008,703, which is titled "Digital compensation for wideband modulation of a phase locked loop frequency synthesizer" by M. Perrott, et al., which is incorporated by reference.

In most conventional control strategies for power electronic systems, e.g. active filters, active rectifiers, etc., both the magnitude and phase angle of the positive-sequence voltage signal are necessary. These quantities are mainly used for synchronization of the system output variables, power flux calculations or for the transformation of state variables into rotating reference frame coordinates. Regardless of the technique used in the detection process, the amplitude and the phase angle estimation of the positive-sequence component must be computed as fast and as accurate as possible despite of the unavoidable disturbances in the electric utility. Among the main disturbances are voltage harmonic distortion, voltage unbalance and angular frequency variations.

The most extended technique used for frequency-insensitive positive-sequence detection is the conventional three-phase PLL based on the synchronous reference frame (SRF-PLL). In the conventional SRF-PLL, the three-phase voltage vector is translated from the natural reference frame to the rotating reference frame by using a combination of Clarke's and Park's transformations. The angular position of this reference frame is controlled by a feedback loop which regulates the q-component of the positive sequence of the voltage to zero. Therefore in steady-state, the detected d-component depicts the voltage vector amplitude, while its phase angle is determined by the output of the feedback loop. Under ideal utility conditions, i.e., neither harmonic distortion nor unbalance is present, a high band-width feedback loop of the SRF-PLL yields a fast and precise detection of the phase angle and amplitude of the utility voltage vector. In case the utility voltage is distorted with high-order harmonics, the bandwidth of the SRF-PLL feedback loop can be reduced to achieve a satisfactory operation, i.e., to reject and cancel out the effect of the harmonics on the output. However, the PLL bandwidth reduction is not an acceptable solution in the presence of unbalanced grid voltages.

The operation of the conventional SRF-PLL is reported in V. Kaura and V. Blasco, "Operation of a phase locked loop system under distorted utility conditions," IEEE Trans. on Ind. Electr., Vol. 33, No. 1, pp. 58-62, January/February 2007; and in P. Rodríguez, et al., "Decoupled double synchronous reference frame PLL for Power converters control," IEEE Trans. on Ind. Electr., Vol. 22, No. 2, pp. 584-592, March 2007, which are incorporated by reference.

Other possibilities for the positive-sequence detection are based on the instantaneous symmetrical components (ISC), on space vector filters (SVF), and on the recursive weighted least-square estimation algorithm (WLSE), which are reported in A. Ghosh, et al., "A new algorithm for the generation of reference voltages of a DVR using the method of instantaneous symmetrical components," IEEE Power Eng. Rev., Vol. 22, No. 1, pp. 63-65, January 2002; J. Svensson, "Synchronisation methods for grid connected voltage source converters," Proc. Inst. Electr. Eng., Vol. 148, No. 1, pp. 229-235, May. 2001; and H. Song, et al., "An instantaneous phase angle detection algorithm under unbalanced line voltage condition," Proc. IEEE Power Electron. Spec. Conf., Vol. 1, pp. 533-537, August 1999.

SUMMARY OF THE INVENTION

In this document a PLL scheme is presented which is aimed to estimate the angular frequency, and both positive and negative sequences of the fundamental component of an unbalanced three-phase signal. The proposed scheme delivers the estimates of both sequences in fixed frame coordinates, and does not require the transformation of variables to the synchronous reference frame as in most conventional PLLs. This is the reason why the proposed PLL received the name of fixed reference frame PLL (FRF-PLL). The proposed FRF-PLL scheme is designed to properly operate under severe unbalanced conditions and is robust against angular frequency changes in the three-phase source voltage signal. Although not considered in the design, it is shown that the scheme is also robust against harmonic distortion present in the source voltage signal.

The idea behind the design consists in:

(i) Propose a model that can accurately reproduce the evolution of an unbalanced three-phase signal. For this purpose both positive and negative sequence components of the three-phase signal are considered. Most PLLs reported in the literature consider the positive sequence only. In other words, they are all based on the model description of the three-phase line voltage signal $\dot{v}_{\alpha\beta} = J\omega v_{\alpha\beta}$, which holds for the balanced case only. In contrast, the present work introduces a new auxiliary variable $\phi_{\alpha\beta}$, which permits to describe an unbalanced three-phase line voltage signal completely. To realize this, notice that the voltage signal can be represented as the sum of both sequences, i.e., $v_{\alpha\beta} = v_{\alpha\beta}^p + v_{\alpha\beta}^n$, and define the auxiliary variable as the difference between both sequences, i.e., $\phi_{\alpha\beta} = v_{\alpha\beta}^p - v_{\alpha\beta}^n$. Out of this, the three-phase signal $v_{\alpha\beta}$ can be fully described by the system $\dot{v}_{\alpha\beta} = J\omega\phi_{\alpha\beta}$, $\dot{\phi}_{\alpha\beta} = J\omega v_{\alpha\beta}$.

(ii) Based on the proposed model, a state estimator is designed to reconstruct both positive and negative sequences of the three-phase signal. The state estimator is built as a copy of the model with additional damping.

(iii) As the estimator expression involves the angular frequency, then an adaptation law is incorporated to reconstruct the angular frequency as well.

The stability and convergence study of the proposed FRF-PLL scheme follow the Lyapunov's approach, without involving any linearization process.

BRIEF DESCRIPTION OF THE DRAWINGS

FIG. 1 Shows a general schematic diagram of the connection of the FRF-PLL system to the utility grid.

FIG. 2 Shows a detailed block diagram of the proposed FRF-PLL algorithm.

FIG. 3 Shows a transient response of the conventional SRF-PLL when the utility voltage goes from a balanced to an unbalanced condition. (from top to bottom) Utility voltage $v_{123}$, estimated phase angle $\hat{\theta}$, estimated frequency $\hat{\omega}$, and estimated positive-sequence voltage in the synchronous reference frame $\hat{v}_{dq}^{p}$.

FIG. 4 Shows a transient response of the proposed FRF-PLL when the utility voltage passes from a balanced to an unbalanced condition. (from top to bottom) Utility voltage $v_{123}$, estimated phase angle $\hat{\theta}$, estimated angular frequency $\hat{\omega}$, and estimated positive-sequence voltage $\hat{v}_{123}^{p}$.

FIG. 5 Shows a response of the proposed FRF-PLL to an unbalanced distorted utility voltage during start-up. (from top to bottom) Utility voltage $v_{123}$, estimated phase angle $\hat{\theta}$, estimated angular frequency $\hat{\omega}$, and estimated positive-sequence voltage $\hat{v}_{123}^{p}$.

FIG. 6 Shows a transient response of the proposed FRF-PLL to a utility frequency change from 50 Hz to 35 Hz. (from top to bottom) Utility voltage $v_{123}$, estimated phase angle $\hat{\theta}$, estimated angular frequency $\hat{\omega}$, and estimated positive-sequence voltage $\hat{v}_{123}^{p}$.

FIG. 7 Shows a transient response of the proposed FRF-PLL to a utility frequency change from 35 Hz to 50 Hz. (from top to bottom) Utility voltage $v_{123}$, estimated phase angle $\hat{\theta}$, estimated angular frequency $\hat{\omega}$, and estimated positive-sequence voltage $\hat{v}_{123}^{p}$.

DETAILED DESCRIPTION OF THE INVENTION

As previously mentioned, the proposed FRF-PLL scheme is aimed to estimate the angular frequency and the positive-sequence of the fundamental component of an unbalanced three-phase signal. The proposed FRF-PLL scheme is designed to operate properly under severe unbalanced conditions and to be robust against possible angular frequency changes in the three-phase signal. Although not explicitly considered in the design, the proposed FRF-PLL scheme must reduce also the effects of harmonic distortion existent in the three-phase signal.

The model. The idea behind the proposed approach is to propose a model that can reproduce the three-phase signal in the most accurately way. Then, based on this model, a state estimator plus an adaptation law for the angular frequency are designed.

In what follows, it is considered that the three-phase signal is composed only by a fundamental component, with the fundamental frequency given by $\omega = 2\pi f$. Moreover, it is considered that the signal, originally in three-phase coordinates, has been transformed to (fixed frame) $\alpha\beta$-coordinates using the following Clarke transformation $$v_{\alpha\beta} = T_{\alpha\beta} v_{123} \tag{1}$$

where $$v_{\alpha\beta} = \begin{bmatrix} v_\alpha \\ v_\beta \end{bmatrix}, \quad v_{123} = \begin{bmatrix} v_1 \\ v_2 \\ v_3 \end{bmatrix},$$

and matrix $T_{\alpha\beta}$ is given by $$T_{\alpha\beta} = \frac{2}{3}\begin{bmatrix} 1 & -1/2 & -1/2 \\ 0 & \sqrt{3}/2 & -\sqrt{3}/2 \end{bmatrix}, \quad T_{\alpha\beta}^{-1} = \frac{3}{2} T_{\alpha\beta}^T \tag{2a}$$

This non-normalized Clarke's transformation could be preferred since $v_\alpha = v_1$, thus preserving the amplitude and phase angle of $v_\alpha$ equal to those of $v_1$. However, the algorithm is not restricted to this transformation, and thus the following normalized transformation could be used as well without further changes in the scheme.

$$T_{\alpha\beta} = \sqrt{\frac{2}{3}}\begin{bmatrix} 1 & -1/2 & -1/2 \\ 0 & \sqrt{3}/2 & -\sqrt{3}/2 \end{bmatrix}, \quad T_{\alpha\beta}^{-1} = T_{\alpha\beta}^T \tag{2b}$$

All along the document bold typeface characters represent either vectors or matrices, while normal typeface characters represent scalars.

As the unbalanced operation case is considered, then it is very convenient to describe the three-phase signal as the sum of its positive and negative sequences as given below.

$$v_{\alpha\beta} = v_{\alpha\beta}^p + v_{\alpha\beta}^n = e^{J\theta} V_{dq}^p + e^{-J\theta} V_{dq}^n \tag{3}$$

where $$V_{dq}^p = \begin{bmatrix} V_d^p \\ V_q^p \end{bmatrix}, \quad V_{dq}^n = \begin{bmatrix} V_d^n \\ V_q^n \end{bmatrix}$$

are the vectors of coefficients, also referred as phasors, of the positive and negative sequences, respectively, of the fundamental component of $v_{\alpha\beta}$. Superscripts p and n stand for the positive and negative sequences, respectively, while subscripts d and q stand for the quadrature components in the rotational frame, and the rotation matrix $e^{J\theta}$ is given by $$e^{J\theta} = \begin{bmatrix} \cos(\theta) & \sin(\theta) \\ -\sin(\theta) & \cos(\theta) \end{bmatrix}, \quad J = \begin{bmatrix} 0 & -1 \\ 1 & 0 \end{bmatrix} \tag{4}$$

where $e^{-J\theta} = (e^{J\theta})^T$, $J^T = -J$.

Based on description (3), the following relationship is obtained $$\dot{v}_{\alpha\beta} = J\omega e^{J\theta} V_{dq}^p - J\omega e^{-J\theta} V_{dq}^n = J\omega(v_{\alpha\beta}^p - v_{\alpha\beta}^n) \tag{5}$$

where $\dot{\theta} = \omega$ represents the true angular frequency.

To get a compact form of the model it is convenient to make the following definition $$\phi_{\alpha\beta} \triangleq v_{\alpha\beta}^p - v_{\alpha\beta}^n \tag{6}$$

Out of which $$\dot{v}_{\alpha\beta}=J\omega\phi_{\alpha\beta} \quad (7)$$

Notice also that $$\dot{\phi}_{\alpha\beta}=J\omega e^{J\theta}V_{dq}^{p}+J\omega e^{-J\theta}V_{dq}^{n}=J\omega(v_{\alpha\beta}^{p}+v_{\alpha\beta}^{n})=J\omega v_{\alpha\beta} \quad (8)$$

Summarizing, the model that completely describes the generator of signal $v_{\alpha\beta}$ is given by $$\dot{v}_{\alpha\beta}=J\omega\phi_{\alpha\beta}$$

$$\dot{\phi}_{\alpha\beta}=J\omega v_{\alpha\beta} \quad (9)$$

It is important to remark that, in the unbalanced case, the introduction of the auxiliary variable $\phi_{\alpha\beta}$ is necessary to allow a complete description of the generator system. Recall that, in the balanced case, this description is reduced to $\dot{v}_{\alpha\beta}=J\omega v_{\alpha\beta}$, without the need of extra variables, as only the positive sequence is considered. In the unbalanced case, however, the negative sequence is considered in addition, which justifies the need for an extra variable $\phi_{\alpha\beta}$. In fact the following relationship between $v_{\alpha\beta}$ and $\phi_{\alpha\beta}$ with the positive and negative sequences can be established based on definitions (3) and (6)

$$\begin{bmatrix} v_{\alpha\beta} \\ \varphi_{\alpha\beta} \end{bmatrix} = \begin{bmatrix} I_2 & I_2 \\ I_2 & -I_2 \end{bmatrix} \begin{bmatrix} v_{\alpha\beta}^{p} \\ v_{\alpha\beta}^{n} \end{bmatrix} \quad (10)$$

whose inverse is given by $$\begin{bmatrix} v_{\alpha\beta}^{p} \\ v_{\alpha\beta}^{n} \end{bmatrix} = \frac{1}{2}\begin{bmatrix} I_2 & I_2 \\ I_2 & -I_2 \end{bmatrix} \begin{bmatrix} v_{\alpha\beta} \\ \varphi_{\alpha\beta} \end{bmatrix} \quad (11)$$

where $I_2$ is the 2×2 identity matrix.

As previously mentioned, one of the objectives in this work consists in estimating the true angular frequency $\omega$ based on the model (9). However, as observed in (9), this parameter appears in both rows of the system. A reparameterization process is thus necessary to concentrate this parameter in a single entry. This can be solved by using the following transformation $$\psi_{\alpha\beta} = \frac{\varphi_{\alpha\beta}}{\omega} \quad (12)$$

which yields the following model $$\dot{v}_{\alpha\beta}=J\omega^2\psi_{\alpha\beta}$$

$$\dot{\psi}_{\alpha\beta}=Jv_{\alpha\beta} \quad (13)$$

Moreover, it is convenient to define $$\sigma \Box \omega^2 \quad (14)$$

Out of which the model can be rewritten as $$\dot{v}_{\alpha\beta}=J\sigma\psi_{\alpha\beta}$$

$$\dot{\psi}_{\alpha\beta}=Jv_{\alpha\beta} \quad (15)$$

which contains only a single parameter $\sigma$ to estimate.

Based on system (15), the objective consists in designing:

(i) An estimator for state variables $v_{\alpha\beta}$ and $\psi_{\alpha\beta}$, out of which the positive sequence component $v_{\alpha\beta}^{p}$ can be obtained according to (11).

(ii) An adaptive law to reconstruct parameter $\sigma$, out of which the angular frequency $\omega$ can be obtained according to (14).

Estimation of the positive sequence component. The proposed estimator consists in a copy of the system model to which a damping term is added, that is, $$\dot{\hat{v}}_{\alpha\beta}=J\hat{\sigma}\hat{\psi}_{\alpha\beta}+\lambda(v_{\alpha\beta}-\hat{v}_{\alpha\beta})$$

$$\dot{\hat{\psi}}_{\alpha\beta}=J\hat{v}_{\alpha\beta} \quad (16)$$

where $\hat{v}_{\alpha\beta}$ and $\hat{\psi}_{\alpha\beta}$ represent the estimates of $v_{\alpha\beta}$ and $\psi_{\alpha\beta}$, respectively; $\hat{\sigma}$ is the estimate of parameter $\sigma$; and $\lambda$ is a positive design parameter used to introduce damping.

The error model turns out to be $$\dot{\tilde{v}}_{\alpha\beta}=J\sigma\psi_{\alpha\beta}-J\hat{\sigma}\hat{\psi}_{\alpha\beta}-\lambda\tilde{v}_{\alpha\beta}$$

$$\dot{\tilde{\psi}}_{\alpha\beta}=J\tilde{v}_{\alpha\beta} \quad (17)$$

where $\tilde{v}_{\alpha\beta}\Box v_{\alpha\beta}-\hat{v}_{\alpha\beta}$, $\tilde{\psi}_{\alpha\beta}\Box\psi_{\alpha\beta}-\hat{\psi}_{\alpha\beta}$ have been defined.

After some straightforward manipulations the error model can be rewritten as $$\dot{\tilde{v}}_{\alpha\beta}=J\sigma\tilde{\psi}_{\alpha\beta}-\lambda\tilde{v}_{\alpha\beta}$$

$$\dot{\tilde{\psi}}_{\alpha\beta}=J\tilde{v}_{\alpha\beta} \quad (18)$$

where $\tilde{\sigma}\Box\hat{\sigma}-\sigma$ has been defined.

According to (11) and (14) the positive and negative sequences can be reconstructed as follows $$\begin{bmatrix} \hat{v}_{\alpha\beta}^{p} \\ \hat{v}_{\alpha\beta}^{n} \end{bmatrix} = \frac{1}{2}\begin{bmatrix} I_2 & I_2 \\ I_2 & -I_2 \end{bmatrix} \begin{bmatrix} \hat{v}_{\alpha\beta} \\ \hat{\varphi}_{\alpha\beta} \end{bmatrix} = \frac{1}{2}\begin{bmatrix} I_2 & I_2 \\ I_2 & -I_2 \end{bmatrix} \begin{bmatrix} \hat{v}_{\alpha\beta} \\ \hat{\omega}\hat{\psi}_{\alpha\beta} \end{bmatrix} \quad (19)$$

Estimation of the angular frequency. The design of the adaptive law to reconstruct $\hat{\sigma}$ (and thus $\hat{\omega}=\sqrt{\hat{\sigma}}$) follows the Lyapunov approach. For this purpose the following quadratic storage function is proposed $$W = \frac{\tilde{v}_{\alpha\beta}^{T}\tilde{v}_{\alpha\beta}}{2} + \frac{\sigma\tilde{\psi}_{\alpha\beta}^{T}\tilde{\psi}_{\alpha\beta}}{2} + \frac{\tilde{\sigma}^2}{2\gamma} \quad (20)$$

Its time derivative along the trajectories of the error model (18) is given by $$\dot{W} = \tilde{v}_{\alpha\beta}^{T}J\sigma\tilde{\psi}_{\alpha\beta} - \lambda\tilde{v}_{\alpha\beta}^{T}\tilde{v}_{\alpha\beta} - \tilde{v}_{\alpha\beta}^{T}J\tilde{\sigma}\tilde{\psi}_{\alpha\beta} + \sigma\dot{\tilde{\psi}}_{\alpha\beta}^{T}\tilde{\psi}_{\alpha\beta} + \frac{\tilde{\sigma}}{\gamma}\dot{\tilde{\sigma}} \quad (21)$$

$$= -\lambda\tilde{v}_{\alpha\beta}^{T}\tilde{v}_{\alpha\beta} - \tilde{v}_{\alpha\beta}^{T}J\tilde{\sigma}\hat{\psi}_{\alpha\beta} + \frac{\tilde{\sigma}}{\gamma}\dot{\tilde{\sigma}}$$

which is made negative semidefinite by proposing the following adaptive law $$\dot{\hat{\sigma}}=\gamma\tilde{v}_{\alpha\beta}^{T}J\hat{\psi}_{\alpha\beta} \quad (22)$$

where $\gamma$ is a positive design parameter.

This yields $$\dot{W}=-\lambda\tilde{v}_{\alpha\beta}^{T}\tilde{v}_{\alpha\beta} \quad (23)$$

The stability and convergence proof can be completed using Lasalle's arguments, or using the properties of signals as follows. From (22) all error signals are bounded, i.e., $\tilde{v}_{\alpha\beta} \in L_\infty$, $\tilde{\psi}_{\alpha\beta} \in L_\infty$, $\tilde{\sigma} \in L_\infty$, equivalently all estimates are bounded as well, i.e., $\hat{v}_{\alpha\beta} \in L_\infty$, $\hat{\psi}_{\alpha\beta} \in L_\infty$, $\hat{\sigma} \in L_\infty$. This implies that the time derivative of the error is bounded as well, i.e., $\dot{\tilde{v}}_{\alpha\beta} \in L_\infty$ (or equivalently $\dot{\hat{v}}_{\alpha\beta} \in L_\infty$). As $\tilde{v}_{\alpha\beta}$ is continuous and bounded, and based on the fact that $\tilde{v}_{\alpha\beta} \in L_2 \cap L_\infty$, then $\tilde{v}_{\alpha\beta} \to 0$ and $\dot{\tilde{v}}_{\alpha\beta} \to 0$ as $t \to \infty$. This implies, in their turn, that $\dot{\tilde{\psi}}_{\alpha\beta} \to 0$ and $\tilde{\sigma} \to 0$ as $t \to \infty$ and thus $\tilde{\psi}_{\alpha\beta}$ and $\tilde{\sigma}$ (or equivalently $\hat{\sigma}$) go to constant values. Considering $\tilde{v}_{\alpha\beta} \equiv 0$, then from (18) $\sigma\tilde{\psi}_{\alpha\beta} = \tilde{\sigma}\hat{\psi}_{\alpha\beta}$, however, $\tilde{\sigma}\hat{\psi}_{\alpha\beta}$ is a rotating vector while simultaneously the product $\sigma\tilde{\psi}_{\alpha\beta}$ is a constant, hence, the only possibility is that $\tilde{\sigma} \to 0$ and $\tilde{\psi}_{\alpha\beta} \to 0$ as well. Notice that, no linearization process has been involved at all, and thus, both stability and convergence might be stated globally. This is, however, not fully true, as the operative region is bounded due to physical construction limitations.

Based on the fact that $\dot{\tilde{\sigma}} = \dot{\hat{\sigma}}$, the adaptive law (21) is equivalent to $$\dot{\hat{\sigma}} = \gamma \tilde{v}_{\alpha\beta}^T J \hat{\psi}_{\alpha\beta} \quad (24)$$

which can also be rewritten as $$\dot{\hat{\sigma}} = -\gamma \hat{\psi}_{\alpha\beta}^T J \tilde{v}_{\alpha\beta} \quad (25)$$

Summarizing, the proposed estimator plus the adaptive law are given by $$\dot{\hat{v}}_{\alpha\beta} = J\hat{\sigma}\hat{\psi}_{\alpha\beta} + \lambda \tilde{v}_{\alpha\beta}$$

$$\dot{\hat{\psi}}_{\alpha\beta} = J\hat{v}_{\alpha\beta} \quad (26)$$

$$\dot{\hat{\sigma}} = \gamma \tilde{v}_{\alpha\beta}^T J \hat{\psi}_{\alpha\beta} \quad (27)$$

where the angular frequency can be obtained as follows $$\hat{\psi} = \sqrt{\hat{\sigma}} \quad (28)$$

And thus the positive and negative sequences can be reconstructed by means of the following inverse transformation $$\begin{bmatrix} \hat{v}_{\alpha\beta}^p \\ \hat{v}_{\alpha\beta}^n \end{bmatrix} = \frac{1}{2} \begin{bmatrix} I_2 & I_2 \\ I_2 & -I_2 \end{bmatrix} \begin{bmatrix} \hat{v}_{\alpha\beta} \\ \hat{\omega}\hat{\psi}_{\alpha\beta} \end{bmatrix} \quad (29)$$

Each of these estimated positive and negative sequence vectors or their combination can now be transformed to the original three-phase coordinates by using the inverse Clarke's transformation (2a) (or (2b) accordingly).

Design criteria for the FRF-PLL algorithm parameters. A first approximation for the tuning of parameters $\lambda$ and $\gamma$ is based on the desired bandwidth frequency $\omega_{BW}$ of the FRF-PLL frequency response. As the algorithm involves the computation of projections between vectors of sinusoidal signals producing mainly a second order harmonic, then the bandwidth of the algorithm should be limited by $2\omega$. It is common in practice to select the bandwidth as $\frac{1}{10}$ of such frequency, that is, $\omega_{BW} = \omega/5$. Based on this consideration, the parameters can be tuned according to the following expressions $$\lambda = 2\omega_{BW} \quad (30)$$

-continued $$\gamma = 2\left(\frac{\omega_0 \omega_{BW}}{|v_{\alpha\beta}|}\right)^2$$

where $\omega_0$ is the nominal value of the angular frequency of the source voltage.

In the numerical results the following parameters have been selected $\lambda = 300$ and $\lambda = 2.2 \times 10^5$, which correspond approximately to a bandwidth of 24 Hz ($\omega_{BW} = 150$ rad/s), considering a nominal frequency of 50 Hz ($\omega_0 = 314.16$ rad/s).

For the numerical results the following cases have been considered for the utility voltage source:

(i) Balanced condition. the voltage source is formed only by a positive sequence of 100 V of amplitude and angular frequency of 50 Hz (314.16 rad/s), with a zero phase shift.

(ii) Unbalanced condition: the voltage source includes both a positive and a negative sequence components. The positive sequence has 100 V of amplitude at 50 Hz (314.16 rad/s) and zero phase shift. For the negative sequence an amplitude of 30 V and zero phase shift are considered.

(iii) Unbalanced and distorted condition: harmonics 3rd and 5th are added to the previous unbalanced signal to create a periodic distortion. Both harmonics have also a negative sequence to allow unbalance. Both the positive and the negative sequence have 10 V of amplitude and zero phase shift.

(iv) Utility frequency changes. The frequency of the utility voltages is step changed from 50 Hz (314.16 rad/s) to 35 Hz (219.9 rad/s) and back.

DESCRIPTION OF THE DRAWINGS

FIG. 1 depicts the connections diagram of the proposed FRF-PLL algorithm to the voltage source. The system includes a coordinates transformation processor 104 receiving source voltages 101, 102 and 103 corresponding to the first, second, and third phase, respectively. The output of the coordinates transformation processor 105 is coupled with the estimator and adaptive processors block 106. The estimator and adaptive processors block estimates the source voltage 107 in $\alpha\beta$-coordinates, auxiliary variable 108 and the angular frequency 112. The positive and negative sequence components, 110 and 111, respectively, can be recovered by the signal reconstruction processor 109.

FIG. 2 depicts a detailed block diagram of the proposed algorithm. Input ports 201, 202 and 203 receive the voltages in three-phase coordinates. The coordinates transformation processor 204, contains the (normalized or non-normalized) Clarke's transformation to convert from three-phase to stationary frame coordinates (123-coordinates to $\alpha\beta$-coordinates). The output port 205 of this module is the voltage vector in $\alpha\beta$-coordinates.

The error signal vector $\tilde{v}_{\alpha\beta}$ is computed in adder 209 whose inputs are the voltage vector 205 and the estimated voltage vector 206, both in $\alpha\beta$-coordinates. This error signal vector is multiplied by a predetermined constant $\lambda$ in 210. The output of module 210 is added in adder 211 to a vector obtained in the multiplier module 216. The resultant vector from adder 211 is operated by the matricial integrator module 212 providing the estimated voltage vector. The estimated voltage vector is sent to output port 206, and to adder 209. The estimated voltage vector is also operated by the matrix in 213. The vector obtained in module 213 is integrated in the matricial integrator module 214 providing an estimated auxiliary variable. The estimated auxiliary variable is coupled to the output port 207, and to the matrix 215. The output vector of matrix module 215 is coupled to multiplier 216.

The error signal vector $\tilde{v}_{\alpha\beta}$ is also provided to the inner product (or dot product) module 217 to obtain the inner product between the error signal vector $\tilde{v}_{\alpha\beta}$ and the vector provided by the matrix module 215. This product is multiplied by a predetermined constant γ in 218 and then integrated in the scalar integrator module 219. The output of integrator module 219 is coupled to multiplier 216 and also it is coupled with the root module 220. The output of the root module 220 is the estimated angular frequency obtained in the adaptive processor which is sent to output port 208.

The estimated angular frequency 208 and auxiliary vector 207 are multiplied in the multiplier module 221. This product vector is added to the estimated voltage vector 206 in adder 222 and subtracted from the estimated voltage vector in adder 223. The outputs of these adders are multiplied by predetermined gains ½ in 224 and 225, respectively. The outputs of 224 and 225 modules are the positive sequence component $v_{\alpha\beta}^p$ and the negative sequence component $v_{\alpha\beta}^n$, respectively, which are sent to output ports 226 and 227, respectively.

FIG. 3 shows the transient response obtained with the conventional SRF-PLL algorithm when the utility voltage 301 goes from a balanced to an unbalanced operation condition at time t=3 s. In general, it is observed a considerable fluctuation in most signals due to the impossibility of the conventional SRF-PLL scheme to deal with the unbalance condition. Moreover, the SRF-PLL has been tuned, following standard guidelines, to have a high bandwidth, which also contributes to the considerable deterioration of signals. For instance, notice that, after the unbalanced condition is started at 3 s, the estimated phase angle $\hat{\theta}$ 302 (solid line) is considerably distorted compared with the true phase angle θ=ωt (dashed line) 303. It is observed also that the estimated angular frequency $\hat{\omega}$ 304 gets a considerable fluctuation around its reference 305 fixed to 314.16 rad/s. Similarly, the estimated positive sequence voltages in the synchronous frame $v_d^p$ and $v_q^p$, 306 and 307, respectively, show a fluctuation at twice the fundamental frequency. As the SRF-PLL has been tuned to have a high bandwidth, the q component of the voltage $v_q^p$ achieves a nearly zero value.

FIG. 4 shows the transient response obtained with the proposed FRF-PLL algorithm when the utility voltage 401 goes from a balanced to an unbalanced operation condition at time t=3 s. Notice that, after a relatively short transient, all signals return to their desired values. For instance, it is observed that the estimated phase angle $\hat{\theta}$ (solid line) 402 follows perfectly well the true phase angle θ=ωt (dashed line) 403 after an almost imperceptible transient. The estimated frequency $\hat{\omega}$ (solid line) 404 is also maintained in its reference fixed to 316.14 rad/s (dotted line) 405 after a small transient. Moreover, the estimated positive-sequence voltages $v_{123}^p$ 406 have an almost imperceptible variation.

FIG. 5 presents the transient response of the proposed FRF-PLL to an unbalanced and distorted utility voltage 501 and during a start-up operation. It is shown that after a relatively small transient the estimated phase angle $\hat{\theta}$ (solid line) 502 is synchronized to the true phase angle θ=ωt (dashed line) 503. Similarly, the estimated angular frequency $\hat{\omega}$ reaches, after a small transient, its reference (dotted line) 505, which has been fixed to 316.14 rad/s. The bottom plot shows that the estimated positive-sequence voltages $v_{123}^p$ 506 reach their final amplitude of 100 V after a few cycles.

FIG. 6 shows the transient response of the proposed FRF-PLL to a step change in the angular frequency of the source voltage 601 going from 50 Hz to 35 Hz. It is shown that after a short transient the estimated phase angle $\hat{\theta}$ 602 follows perfectly well the true phase angle θ=ωt 603. It is shown that the estimated angular frequency $\hat{\omega}$ 604, starting at a reference 605 of 314.16 rad/s, reaches its new reference 606 fixed to 219.9 rad/s in a relatively short time. The bottom plot shows that the estimated positive-sequence voltages $v_{123}^p$ 607 maintain their amplitude after an almost imperceptible transient.

FIG. 7 depicts the transient response of the proposed FRF-PLL to a step change in the angular frequency of the source voltage 701 going from 35 Hz to 50 Hz. As in FIG. 6, the estimated phase angle $\hat{\theta}$ 702 follows perfectly well the true phase angle θ=ωt 703 after a short transient. It is shown that the estimated angular frequency $\hat{\omega}$ 704, starting at a reference 705 of 219.9 rad/s, reaches its new reference 706 fixed to 314.16 rad/s in a relatively short time. The bottom plot shows that the estimated positive-sequence voltages $v_{123}^p$ 707 maintain their amplitude after an almost imperceptible transient.

What is claimed is:

1. A fixed reference frame phase locked loop system for providing estimates for an angular frequency, a positive sequence, and a negative sequence for a fundamental component of an unbalanced three-phase signal, the system adapted to be coupled to a three-phase power distribution device having a first phase, a second phase, and a third phase, the three-phase power distribution device providing a voltage for each phase, the system comprising:

a voltage module connected to the three-phase power distribution device to provide a signal indicative of the value of the voltage in each phase of the three-phase power distribution device;

a coordinate transformation processor connected to the voltage module for receiving the signal of the value of the voltages in each of the three-phase power distribution device and convert the measured three-phase voltage vector values into a voltage vector in αβ-coordinates;

an estimator processor connected to the coordinates transformation processor, wherein the estimator processor receives the voltage vector $v_{\alpha\beta}$ in αβ-coordinates, wherein the estimator processor provides the estimate voltage vector $\hat{v}_{\alpha\beta}$ and the auxiliary variable $\hat{\psi}_{\alpha\beta}$, both in αβ-coordinates;

an adaptive processor connected to the to the coordinates transformation processor, wherein the adaptive processor receives an error signal vector $\tilde{v}_{\alpha\beta}$ and provide an estimated angular frequency $\hat{\omega}$;

a signal reconstruction processor connected to the adaptive processor and the estimator processor, wherein the signal reconstruction processor receives the estimate voltage vector $\hat{v}_{\alpha\beta}$, the auxiliary variable $\hat{\psi}_{\alpha\beta}$, and the estimated angular frequency $\hat{\omega}$, wherein the signal reconstruction processor provides an estimated positive sequence $\hat{v}_{\alpha\beta}^p$ and an estimated negative sequences and $\hat{v}_{\alpha\beta}^n$, αβ-coordinates; and wherein the positive sequence and the negative sequence are in a fixed reference frame coordinates.

2. The system according to claim 1 wherein the voltage module comprises three voltage sensors.

3. The system of claim 1 wherein the coordinates transformation processor is a Clarke's transformation, either normalized or non normalized expressed by $$T_{\alpha\beta} = \sqrt{\frac{2}{3}} \begin{bmatrix} 1 & -1/2 & -1/2 \\ 0 & \sqrt{3}/2 & -\sqrt{3}/2 \end{bmatrix}$$

or $$T_{\alpha\beta} = \frac{2}{3} \begin{bmatrix} 1 & -1/2 & -1/2 \\ 0 & \sqrt{3}/2 & -\sqrt{3}/2 \end{bmatrix},$$

respectively.

4. The system of claim 1 wherein the estimator processor comprises:
   a first adder module forming a first difference vector $\tilde{v}_{\alpha\beta}$ equal to the difference between the voltage vector $v_{\alpha\beta}$ and the estimated voltage vector $\hat{v}_{\alpha\beta}$;
   a first gain $\lambda$ to multiply the first difference vector forming a scaled vector $\lambda \tilde{v}_{\alpha\beta}$;
   a second adder module for adding the scaled vector and a vector $J\hat{\sigma}\hat{\psi}_{\alpha\beta}$ to form a vector $\lambda \tilde{v}_{\alpha\beta} + J\hat{\sigma}\hat{\psi}_{\alpha\beta}$;
   a first matricial integrator module $$\begin{bmatrix} 1/s & 0 \\ 0 & 1/s \end{bmatrix}$$

for receiving the vector $\lambda \tilde{v}_{\alpha\beta} + J\hat{\sigma}\hat{\psi}_{\alpha\beta}$ and forming the estimated voltage vector $\hat{v}_{\alpha\beta}$;
   a first matrix module that represents the matrix $$J = \begin{bmatrix} 0 & -1 \\ 1 & 0 \end{bmatrix},$$

operating on the estimated voltage vector forming a vector $J\hat{v}_{\alpha\beta}$;
   a second matricial integrator module $$\begin{bmatrix} 1/s & 0 \\ 0 & 1/s \end{bmatrix}$$

operating on the vector $J\hat{v}_{\alpha\beta}$; and forming the auxiliary variable $\hat{\psi}_{\alpha\beta}$;
   a second matrix module, that represents the matrix $$J = \begin{bmatrix} 0 & -1 \\ 1 & 0 \end{bmatrix},$$

operating over the auxiliary variable $\hat{\psi}_{\alpha\beta}$ forming a vector $J\hat{\psi}_{\alpha\beta}$; and
   a first multiplier module multipliying the vector $J\hat{\psi}_{\alpha\beta}$ with a scalar variable $\hat{\sigma}$ forming $J\hat{\sigma}\hat{\psi}_{\alpha\beta}$.

5. The system of claim 1 wherein the adaptive processor comprises:
   a first inner product module forming an inner product between the error signal vector $\tilde{v}_{\alpha\beta}$ and a vector $J\hat{\psi}_{\alpha\beta}$, that is, $v_{\alpha\beta}^T J\hat{\psi}_{\alpha\beta}$;
   a first gain $\gamma$ for multiplying the inner product forming a scaled inner product $\gamma v_{\alpha\beta}^T J\hat{\psi}_{\alpha\beta}$;
   a scalar integrator module for receiving the scaled inner product to form a variable $\hat{\sigma}$; and
   a root module for receiving the variable $\hat{\sigma}$ and forming an estimated angular frequency $\hat{\psi}$.

6. The system according to claim 1 wherein the signal reconstruction processor comprises:
   a first multiplier module receiving the estimated angular frequency $\hat{\psi}$ and the auxiliary variable $\hat{\psi}_{\alpha\beta}$ forming a vector $\hat{\omega}\hat{\psi}_{\alpha\beta}$;
   a first adder module for adding the estimated voltage vector $\hat{v}_{\alpha\beta}$ and the vector $\hat{\omega}\hat{\psi}_{\alpha\beta}$;
   a second adder module for subtracting $\hat{\omega}\hat{\psi}_{\alpha\beta}$ from the estimated voltage vector $\hat{v}_{\alpha\beta}$;
   a first gain for multiplying the result of the first adder module and forming the estimated positive sequence voltage $\hat{v}_{\alpha\beta}^p$; and
   a second gain for multiplying the result of the second adder module forming the estimated negative sequence voltage $\hat{v}_{\alpha\beta}^n$.

7. The system of claim 4, wherein the gain $\lambda$ is a predetermined design constant that is greater than zero, and a first approximation is $\lambda = 2\omega_{BW}$.

8. The system of claim 4 wherein the definition of the auxiliary variable $\hat{\psi}_{\alpha\beta}$ permits the concentration of the angular frequency parameter $\omega$ in a single entry, facilitating the design of the adaptive algorithm to estimate the angular frequency $\omega$.

9. The system of claim 5 wherein the gain $\gamma$ is a predetermined design constant that is greater than zero, and a first approximation is $$\gamma = 2\left(\frac{\omega_0 \omega_{BW}}{|v_{\alpha\beta}|}\right)^2.$$

* * * * *